United States Patent [19]
Isobe

[11] Patent Number: 5,180,918
[45] Date of Patent: Jan. 19, 1993

[54] METHOD AND APPARATUS FOR MEASURING ION BEAM COLLIMATION, SHAPING THE ION BEAM AND CONTROLLING SCANNING THEREOF

[75] Inventor: Michiro Isobe, Kyoto, Japan

[73] Assignee: Nissin Electric Company, Limited, Kyoto, Japan

[21] Appl. No.: 700,451

[22] Filed: May 15, 1991

[30] Foreign Application Priority Data

May 17, 1990 [JP] Japan ................... 2-127230

[51] Int. Cl.⁵ .......................................... H01J 37/30
[52] U.S. Cl. .................... 250/492.2; 250/397
[58] Field of Search ............ 250/492.2, 492.21, 397, 250/398

[56] References Cited

U.S. PATENT DOCUMENTS

| | | | |
|---|---|---|---|
| 4,011,449 | 3/1977 | Ko et al. | 250/492.21 |
| 4,021,675 | 5/1977 | Shifrin | 250/492.21 |
| 4,494,005 | 1/1985 | Shibata et al. | 250/492.21 |
| 4,751,393 | 6/1988 | Carey et al. | 250/397 |
| 4,785,188 | 11/1988 | Mori et al. | 250/397 |
| 4,922,106 | 5/1990 | Berrian et al. | 250/492.21 |
| 4,967,380 | 10/1990 | Szajnowski | 250/492.21 |
| 5,046,148 | 9/1991 | Nogami et al. | 250/492.21 |
| 5,068,539 | 11/1991 | Nogami et al. | 250/492.21 |

Primary Examiner—Bruce C. Anderson
Attorney, Agent, or Firm—Finnegan, Henderson, Farabow, Garrett and Dunner

[57] ABSTRACT

A method of measuring collimation of an ion beam used for electrostatically-controlled collimated scanning includes the steps of electrically detecting the ion beam to determine the time-dependent change in the scanning position of the ion beam both at an upstream location and at a downstream location of the ion beam, determining upstream and downstream positions of the ion beam at mutually corresponding times based on the time-dependent change determination, and determining the degree of collimation of the ion beam based on the relationship between the upstream and downstream positions.

11 Claims, 5 Drawing Sheets

METHOD AND APPARATUS FOR MEASURING ION BEAM COLLIMATION, SHAPING THE ION BEAM AND CONTROLLING SCANNING THEREOF

BACKGROUND OF THE INVENTION

1. Field of the Invention

The present invention relates to methods and apparatus employing an ion implanter, particularly to methods and apparatus yielding electrostatically-controlled collimated scanning of a target using an ion beam in order to implant ions in the target. The present invention also relates to methods of measuring collimation, shaping the form of the ion beam and controlling its scanning, and to an ion implanter which is capable of implementing the aforementioned methods.

2. Discussion of the Related Art

A prior art ion implanter is shown in part in FIG. 11. In this ion implanter, ions extracted from an ion source (not shown in FIG. 11) are optionally analyzed by a magnetic field according to isotopic mass, accelerated to a desired energy level, and refocused at a spot in order to form an ion beam 2. The ion beam 2 is then deflected for electrostatically-controlled collimated scanning in an X-direction (e.g., horizontal direction X in FIG. 11) by the cooperation of two pairs of scanning electrodes 4 and 6 which are supplied with 180° out-of-phase scanning voltages from a scanning power source 12. Thereafter, the deflected ion beam 2 illuminates a target 8 (e.g., a wafer) on a holder 10. In the prior art ion implanter of FIG. 11, the scanning power source 12 produces scanning voltages of $+V$ and $-V$ which each have a triangular waveform and which are out of phase by 180°.

The target 8 is mechanically scanned in a Y-direction (e.g., vertical direction Y in FIG. 11) which is substantially perpendicular to the X-direction by mechanically altering the position of the holder 10 and the target 8 through the use of, for example, a holder drive unit (not shown in FIG. 11). This mechanical scanning in the Y-direction, when coupled with the electrostatically-controlled collimated scanning in the X-direction achieved through the deflection of ion beam 2 by scanning electrode pairs 4 and 6, allows hybrid scanning in both the X-direction and the Y-direction to be performed. As a result of this hybrid scanning, ions can be implanted uniformly over the entire surface of the target 8.

In the prior art ion implanter of FIG. 11, a beam monitor 14 receives the ion beam 2 in order to measure a beam current I. The beam monitor 14 is provided at one end of a region where the ion beam 2 is scanned in the X-direction. The measured beam current I is fed to the Y-axis of a display 15 and a scanning voltage (e.g., V) is fed to the X-axis of the display so that the status of scanning performed by using the ion beam 2 is monitored during the ion implantation process. A waveform of the beam current I of scanning ion beam 2 is shown in FIG. 12.

In the prior art ion implanter described above, abnormal collimation of the ion beam 2 can occur for various reasons. Such reasons include the failure or deterioration of the scanning power source 12, the breakage or deterioration of the lead wires (not shown in FIG. 11) connecting the scanning power source 12 to the scanning electrodes 4 and 6, and unexpected variations in the configuration of the beam line. If abnormal collimation of the ion beam 2 occurs (i.e., if the ion beam 2 is not well collimated), the scanning speed of the ion beam 2 or the angle of its incidence on the target 8 fluctuates, thereby causing various problems such as lower uniformity in the ion implantation of target 8.

To detect and thereafter correct the problems caused by the abnormal collimation of ion beam 2, the operator of the prior art ion implanter must check for abnormal collimation of the ion beam based on the display of the waveform such as shown in FIG. 12. However, many years of experience are required to correctly interpret such a waveform display. Even if the operator is well experienced, for a variety of reasons, it is difficult for the operator to determine whether the collimation of the ion beam is abnormal by observing the waveform display. Such reasons include, but are not limited to, the following: (1) long-term variations in the collimation of ion beam 2 are difficult for the operator to locate; (2) even when the downstream scanning electrode 6 becomes completely ineffective, a waveform of beam current I, except for a slight shift in peak position, is identical to the one obtained under normal conditions; (3) depending on the ion species, the beam dose, the ion source and other factors, the waveform of beam current I may normally undergo variations or changes similar to those which occur as a result of abnormal collimation; and (4) even if abnormal collimation occurs, a waveform similar to the waveform for normal collimation is still sometimes obtained when the offset voltage of the scanning power source 12 is changed so as to shift the center of the beam scanning.

The scanning waveform controlling an ion beam conventionally has been shaped in accordance with either of the following two major techniques or methods:

(A) Using a multipoint beam monitor provided in the line of ion beam 2 or a single beam monitor which is movable in the scanning direction of the ion beam 2, the beam current is measured at several points along the scanning direction of the ion beam 2 and the scanning waveform controlling the ion beam 2 is shaped based on measured values of the beam current; or (B) A scanning waveform of interest is generated using simulated calculations for distribution of potentials on the beam line of the ion beam 2.

However, methods (A) and (B) have the following problems. In method (A), if the beam monitor is not located in the same position as the target, the difference between the two positions (i.e., $\Delta Z$) causes the following inequality, with reference to FIG. 5, to result:

$$(X_B' - X_B \cdot X_A' - X_A) \neq (x_B' - x_B \cdot x_A' - x_A).$$

This inequality introduces measurement inaccuracies and makes it impossible to create a desired waveform in a sufficiently correct way in order to achieve a speed of scanning over the target which is constant. Therefore, in order to avoid this problem, the beam monitor must be correctly positioned so that it is located in the same position as the target. As a result, a moving mechanism must be provided so that the beam monitor can be moved to a nonobtrusive position during ion implantation into the target. However, this increases the complexity of the shaping system.

Method (B) is disadvantageous in that it involves the construction of a complicated simulation model. Furthermore, it is particularly difficult to evaluate the effects of the edges of the scanning electrodes because such an evaluation requires considerable time to perform correct calculations. Moreover, even if data of preferred scanning waveforms are input into the scanning power source (e.g., arbitrary waveform generator 221 in the power source 22) in accordance with method (B), undesired factors such as the nonlinearity of high voltage amplifiers 222 and 223 can cause the power source 22 to produce an output scanning voltage which does not necessarily agree with the input scanning waveform data and which can vary from one measuring apparatus to another, thereby making it difficult to correctly achieve the shaping of scanning waveforms.

SUMMARY OF THE INVENTION

The present invention has been made in view of the above circumstances and has as an object to provide a method by which the abnormal collimation of an ion beam can be detected in a simple but reliable way.

A further object of the present invention is to provide a method by which not only the abnormal collimation of the ion beam is detected, but also shapes the form, or profile, of that ion beam and controls its scanning in such a way that the speed of the scanning of the ion beam over a target approaches or will become a constant value.

Yet another object of the present invention is to provide an ion implanter which is capable of implementing the methods described above.

Additional objects and advantages of the invention will be set forth in part in the description which follows and in part will be obvious from the description, or may be learned by practice of the invention. The features and advantages of the invention may be realized and attained by means of the instrumentalities and combinations particularly pointed out in the appended claims.

To achieve the objects and in accordance with the purpose of the invention, as embodied and broadly described herein, the invention comprises a method of measuring collimation of an ion beam used for electrostatically-controlled collimated scanning. The measuring method includes the steps of electrically detecting the ion beam to determine a time-dependent change in a scanning position of the ion beam both at an upstream location and at a downstream location of the ion beam, determining the upstream and downstream positions of the ion beam at mutually corresponding times based on the time-dependent change determination, and determining the degree of collimation of the ion beam based on the relationship between the upstream and downstream positions of the ion beam.

The present invention also comprises a method of shaping the form of an ion beam, particularly one used for electrostatically-controlled collimated scanning. The shaping method includes the steps of electrically detecting the ion beam to determine a time-dependent change in a scanning position of the ion beam both at an upstream location and at a downstream location of the ion beam, determining, based on the time-dependent change determination, a time-dependent change in a scanning position of the ion beam on a target in accordance with the relationship between measurement positions at the upstream and downstream locations and the position of the target, and shaping the form of the ion beam such that when the ion beam is scanned over the target, the time-dependent change in the scanning position in the ion beam on the target will be constant.

Additionally, the present invention comprises an ion implanter for performing electrostatically-controlled collimated scanning using an ion beam. The implanter includes a multipoint beam monitor located at an upstream location of the ion beam and a multipoint monitor located at a downstream location of the ion beam, and the monitors each include a plurality of beam detecting points positioned so that each monitor has the same set of detecting point coordinate values in the scanning direction of the ion beam for electrically detecting the ion beam. The positions of the beam detecting points are predetermined.

BRIEF DESCRIPTION OF THE DRAWINGS

The accompanying drawings, which are incorporated in and constitute a part of the specification, illustrate embodiments of the invention, and, together with the description, serve to explain the features, advantages and principals of the invention. In the drawings.

DETAILED DESCRIPTION OF EMBODIMENTS

Figure 1:
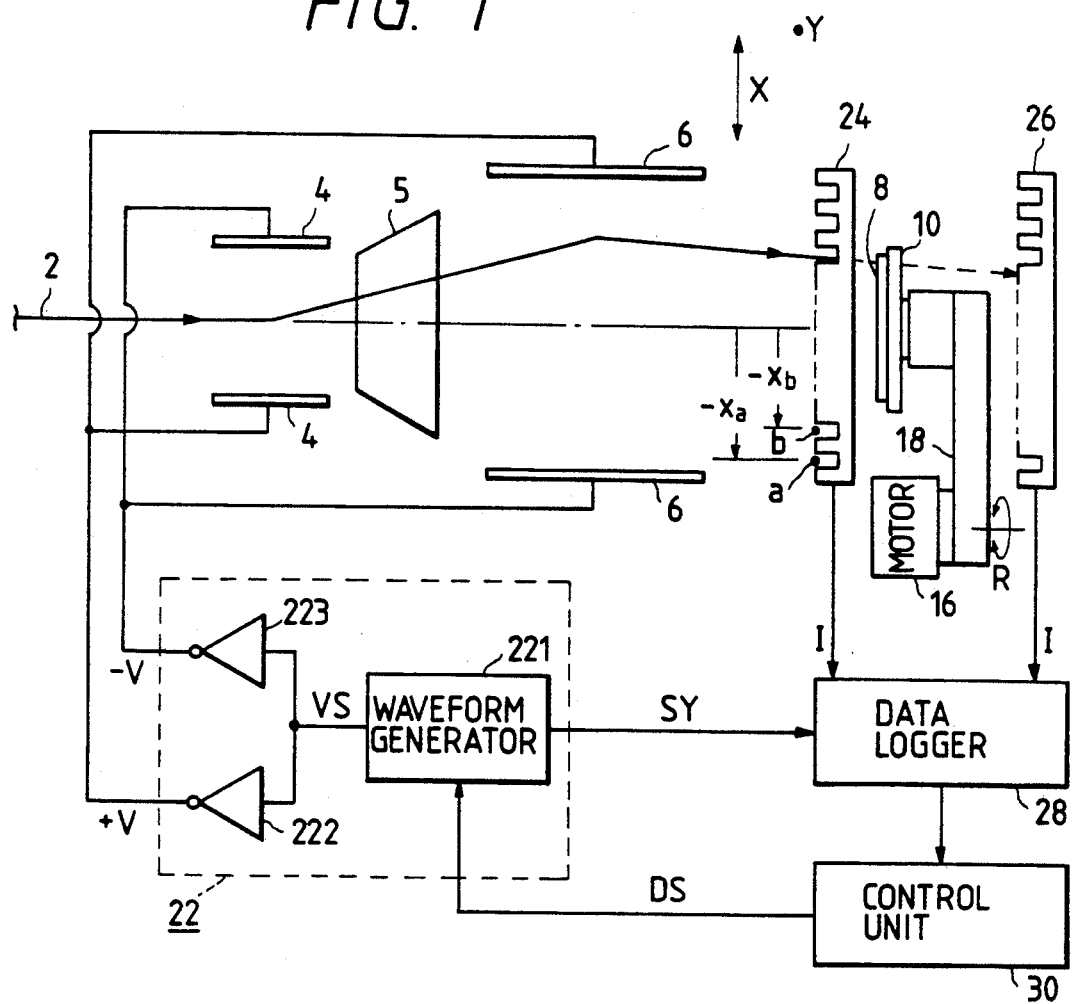
FIG. 1 is a partially schematic diagram and partially pictorial plan view showing in part an ion implanter according to an embodiment of the present invention.
Figure 11:
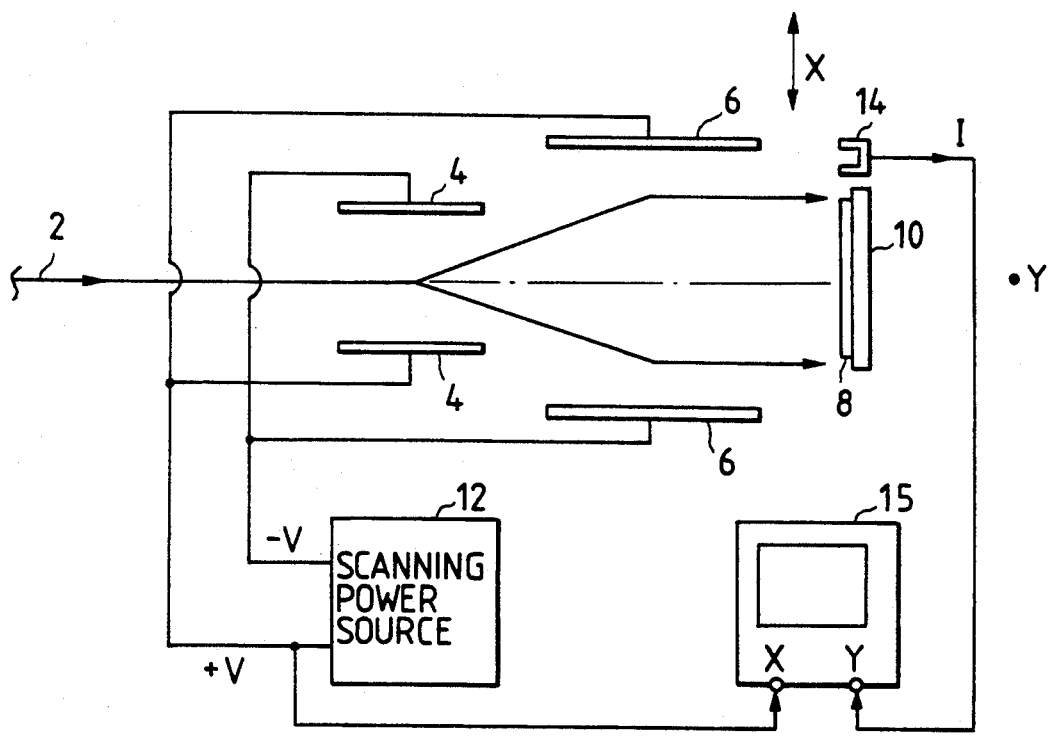
FIG. 11 is a schematic diagram showing in part an example of a prior art ion implanter.
Figure 12:
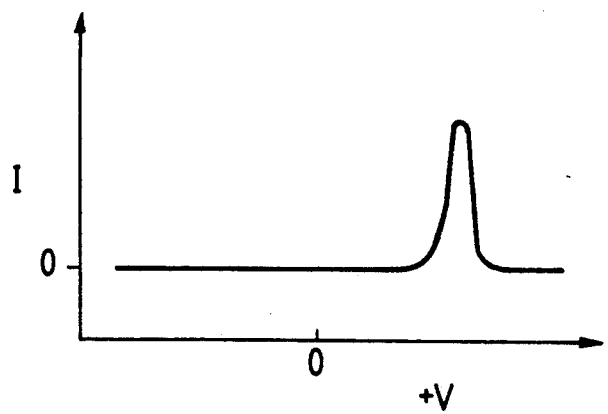
FIG. 12 is a diagram showing a waveform of a beam current during ion implantation.

FIG. 1 is a schematic diagram showing an ion implanter according to an embodiment of the present invention. As in the prior art ion implanter shown in FIG. 11, ions extracted from an ion source (not shown in FIG. 1) are optionally analyzed by a magnetic field according to isotope mass, accelerated to a desired energy level, and refocused at a spot in order to form ion beam 2. The ion beam 2 is then deflected for electrostatic parallel scanning in an X-direction (e.g., horizontal direction X in FIG. 1) by the cooperation of a pair of upstream scanning electrodes 4 and a pair of downstream scanning electrode 6 which are supplied with 180° out-of-phase scanning voltages from a scanning power source 22. Thereafter, the deflected ion beam 2 illuminates target 8 on a holder 10.

In the ion implanter shown in FIG. 1, a pair of deflecting electrodes 5 is provided between the upstream pair of scanning electrodes 4 and the downstream pair of scanning electrode 6. The electrodes 5 deflect the ion beam 2 in a Y-direction (e.g., vertical direction Y in FIG. 1 and in FIG. 2) by a predetermined angle (best seen in FIG. 2) so that a neutral beam travelling in a straight path out of the upstream pair of scanning electrodes 4 is separated to permit only the desired ion beam 2 to strike the target 8. The deflecting electrodes 5 are also used to permit the ion beam 2 to be fed into a multipoint beam monitor 24 (described below) by changing (i.e., lowering) the voltage applied to these electrodes. In the system shown in FIG. 1, the target 8 is mechanically scanned in the Y-direction (e.g., vertical direction Y in FIG. 1) which is substantially perpendicular to the X-direction by mechanically altering the position of the holder 10 and the target 8 through the rocking of an arm 18 which supports the holder 10. While in FIG. 1, the arm 18 is rocked in the direction of arrow R by a reversing motor (e.g., a direct drive motor) 16 so that the holder 10 and the target 8 will move in the Y-direction, this is not the only way to move the holder 10 and the target 8 in the Y-direction.

Figure 2:
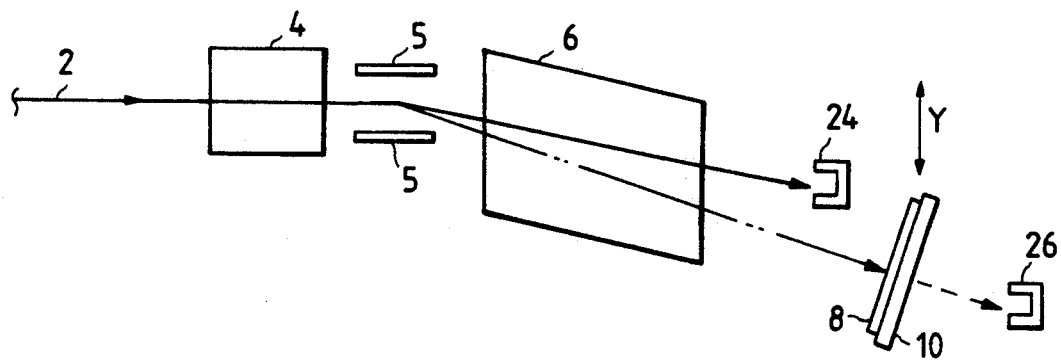
FIG. 2 is a partially schematic diagram and partially pictorial side elevation of the scanning electrodes and associated components of the system shown in FIG. 1.

Referring again to FIG. 1, two multipoint beam monitors 24 and 26 are positioned, respectively, at an upstream location of the ion beam and at a downstream location of the ion beam such that the monitor 24 is located upstream of the target 8 and the other monitor 26 is located downstream of the target 8. Furthermore, the upstream monitor 24 is offset slightly upward so that it will not block the incidence of the ion beam 2 on the target 8, whereas the downstream monitor 26 is located predominantly behind the target 8, as shown in FIG. 2.

The multipoint beam monitors 24 and 26 each include a plurality of beam detecting points for electrically detecting the ion beam 2. The beam detecting points are positioned on each multipoint beam monitor so that each monitor has the same set of detecting point coordinate values in the X-direction in which the ion beam 2 is scanned and the positions of such beam detecting points are predetermined. The multipoint beam monitors 24 and 26 may each be an array of beam current meters (e.g., Faraday cups) which receive the ion beam 2 to measure the beam current I and which are aligned in the X-direction in which the ion beam 2 is scanned. Alternatively, a mask having a plurality of holes arranged in the X-direction may be provided in front of a single beam current meter having a longitudinal axis parallel to the X-direction in order to form each of the multipoint beam monitors.

Whichever arrangement is adopted, each of the multipoint beam monitors 24 and 26 is intended to detect a peak of the ion beam current I (as will be described below) so that particularly high precision of measurement is not required for determining the absolute value of beam current I. In other words, variations in factors such as the amount of detection and sensitivity between different beam current detecting points in each of the beam monitors 24 and 26 will not be serious problems to consider.

The values of the beam current I measured with the multipoint beam monitors 24 and 26 are collected and recorded with a data logger 28. In the embodiment under consideration, the data logger 28 is connected to a control unit 30 that performs mathematical and other operations to be described below on the basis of the data collected by the data logger 28.

Furthermore, in the embodiment under consideration, the scanning power source 22 for supplying scanning voltages $+V$ and $-V$ to the scanning electrodes 4 and 6 is designed to have the following circuit configuration. The scanning power source 22 includes a variable waveform generator 221 having a wide range of variation which, in response to applied scanning waveform data (e.g., scanning waveform data DS supplied from the control unit 30), generates a scanning signal VS having a waveform corresponding to the scanning waveform data. The scanning power source 22 also includes a high-voltage amplifier 222 that boosts the scanning signal VS to output a scanning voltage $+V$, and a high-voltage amplifier 223 that boosts the scanning signal VS to output a scanning voltage $-V$ having a polarity opposite to $+V$.

The variable waveform generator 221 may be of a known type that is capable of generating signals of a variable waveform in accordance with a preset program or in response to applied scanning waveform data. Furthermore, the variable waveform generator 21 supplies the data logger 28 with a sync signal (e.g., a clock signal) SY that synchronizes data collection performed by the upstream multipoint beam monitor 24 with data collection performed by the downstream multipoint beam monitor 26.

The method of measuring the collimation of ion beam 2 in the ion implanter having the construction described above will now be described. In the embodiment under consideration, the collimation of ion beam 2 can be measured at any time when the target 8 or the holder 10 is not in the ion implantation position (i.e., when the ion beam 2 is admitted into all detecting points of the downstream multipoint beam monitor 26), such as when the target 8 is being transported or when the target 8 into which ions are being implanted is moved to a limit of its positions in the Y-direction, as, for example, when it changes its direction of movement from an upward to a downward direction (or vice versa). The steps of the method of measuring the collimation of ion beam 2 are as follows:

(1) The method starts with continuously changing the voltage applied to the deflecting electrodes 5 so that the ion beam 2 is admitted into the upstream multipoint beam monitor 24 and the downstream multipoint beam monitor 26 and scans each of the surfaces of these monitors through at least one cycle (i.e., from left to right and vice versa). In order to achieve corrective measurements, these scanning operations are preferably performed under the same conditions, with respect to other inputs, as are used to implant ions into the target 8.

(2) In step (1), data logger 28, in response to the sync signal (i.e., clock signal) SY from the arbitrary waveform generator 221, samples the beam current I of ion beam 2 from both multipoint beam monitors 24 and 26 in synchronism with the operation of the arbitrary waveform generator 221 for successive one-frame periods.

Figure 3A:
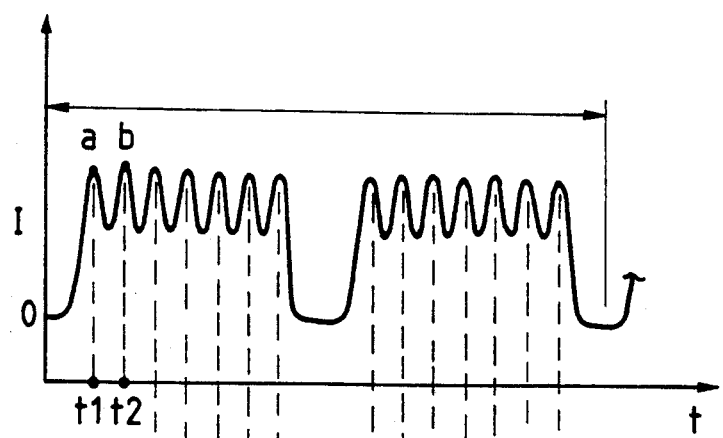
FIG. 3A shows an example of the current waveform of an ion beam measured with a multipoint beam monitor.

(3) By this sampling, data representing the relationship between (a) time t, where t equals the number of clock periods in a frame multiplied by the duration of one clock period and is counted in clock periods of the sync signal SY from the arbitrary waveform generator 221, and (b) beam current I is obtained for each of the upstream multipoint beam monitor 24 and the downstream multipoint beam monitor 26. An example of the data obtained for one of the upstream multipoint monitors is represented in FIG. 3A as a data curve. Both the upstream multipoint beam monitor and the downstream multipoint beam monitor have such a data curve obtained therefor. The data curve of FIG. 3A has a plurality of peaks that each correspond to the state wherein the ion beam 2 is incident the center of a respective beam detecting point on the beam monitor for which the data curve is obtained. It should be noted that FIG. 3A refers to the case where the multipoint beam monitor for which the data curve is obtained is composed of a perforated mask located in front of a single beam current meter.

In FIG. 3A, the times $t_1, t_2 \ldots$ are associated with positions of the respective peaks and can be determined from the number of clocks provided by the sync signal SY.

The positions of the individual beam detecting points in both multipoint beam monitor 24 and multipoint beam monitor 26 are predetermined. For example, as shown in FIG. 1, the positions of beam detecting points a and b in multipoint monitor 24 are expressed as $-xa$ and $-xb$, respectively.

Figure 3B:
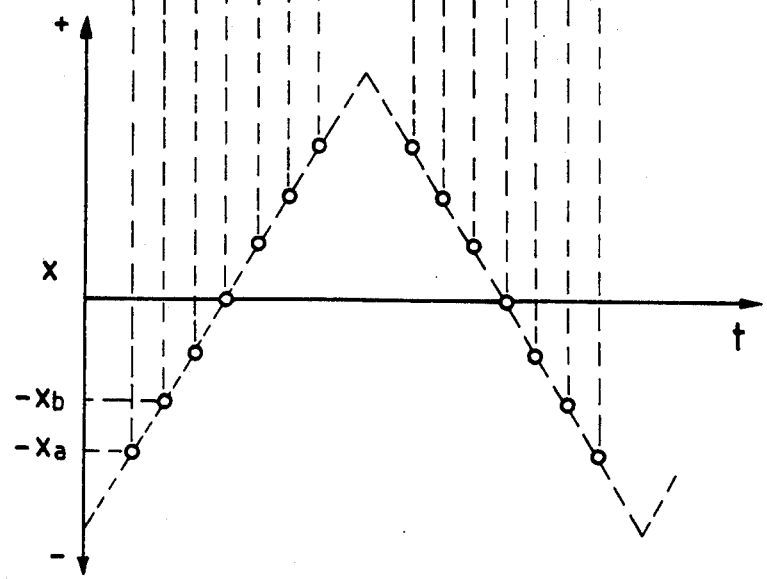
FIG. 3B is a graph showing an example of a scanning position versus time profile of an ion beam which was obtained based on the current waveform shown in FIG. 3A.

(4) The obtained data representing a discrete relationship between time and position is processed by appropriate interpolation and extrapolation, so that as shown in FIG. 3B, a function that represents the continuous time-dependent change of the scanning position x of ion beam 2 is determined for the upstream multipoint beam monitor 24. In the same manner, a function such that shown in FIG. 3B is determined for the downstream multipoint beam monitor 26. If the collimation of the ion beam 2 is consistent for the whole scanning range, the function will assume an ideal triangle waveform as shown in FIG. 3B. However, if it is not, the function will assume a distorted triangular waveform.

(5) Using the two functions (i.e., one for the upstream multipoint beam monitor 24 and the other for the downstream multipoint beam monitor 26), the position $xu(t)$ at which the ion beam 2 scans the upstream multipoint beam monitor 24 at time t and the position $xd(t)$ at which the ion beam 2 scans the downstream multipoint beam monitor 26 at the corresponding time t are determined. Thereafter, the degree of collimation of ion beam 2 at time t is determined based on the relationship between the two positions $xu(t)$ and $xd(t)$.

Figure 4:
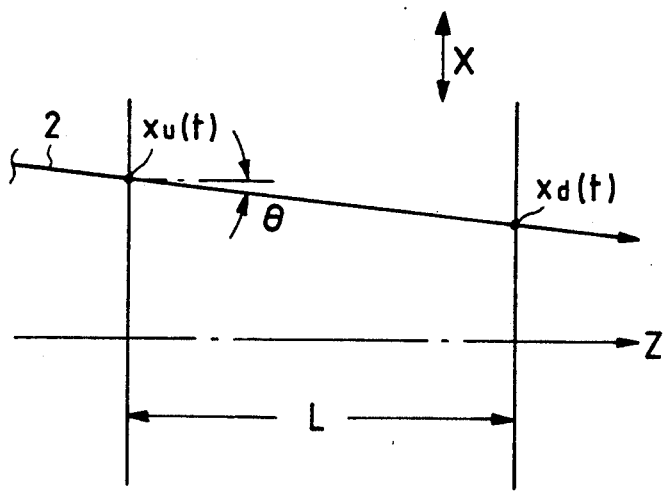
FIG. 4 is a diagram showing an example of the relationship between scanning positions of an ion beam on a multipoint beam monitor located at an upstream location of the ion beam and on a multipoint beam monitor located at a downstream location of the ion beam.

Assuming that the two multipoint beam monitors 24 and 26 are spaced apart by distance L, if the direction perpendicular to the X-direction in which the ion beam 2 is scanned is written as Z (see FIG. 4) and if the angle $\theta$ the ion beam 2 makes with the Z-direction is defined as the degree of its collimation, then the degree of collimation $\theta(t)$ at time t can be quantitatively determined by the following equation:

$$\theta(t) = \tan^{-1}\{(xu(t) - xd(t))/L\}. \quad (1)$$

If the ion beam 2 at a given time is completely parallel with respect the Z-direction, then $\theta = 0°$. By altering the time t of interest, the collimation of ion beam 2 at a plurality of points within the scanning range, namely, the distribution of the degrees of collimation, can be determined with a high resolution.

In place of determining $\theta(t)$, either $xu(t) - xd(t)$ or $xu(t)/xd(t)$ may be calculated for conveniently determining the collimation of ion beam 2.

By the foregoing method, the measurement of the collimation of the ion beam can be completed.

In the embodiment under consideration, the above-described method or procedure for determining the collimation of ion beam 2 based on the data of beam current I collected by the data logger 28 was assumed to be performed with a control unit 30. However, if desired, this method may be performed by the operator.

According to the foregoing method, the collimation of ion beam 2 and its profile and the beam scanning direction can be determined quantitatively and with high precision without relying upon the experience or hunches of the operator. Hence, abnormal collimation of the ion beam 2 that may occur because of one or more of the causes described in connection with the prior art can be detected in a simple and reliable way.

One of the conventional methods for measuring the collimation of ion beam 2 includes the steps of passing an ion beam through each of the holes in a perforated mask placed in front of chart paper and examining the relationship between holes and the positions of resulting scorches found on the chart paper. This method, however, has a problem in that is very cumbersome and time-consuming. For example, each time the measurement is to be conducted, the perforated mask and the chart paper must be brought into the vacuum chamber enclosing the ion implanter after destroying the vacuum in that chamber.

The aforementioned problem is entirely absent from the method of the present invention because the method of the present invention detects the ion beam 2 electrically using multipoint beam monitors 24 and 26. As a result, there is no need to destroy the vacuum in the vacuum chamber and the collimation of ion beam 2 can be measured as required in a simple way and with the vacuum chamber left in tact.

For electrical detection of the ion beam 2, it is not absolutely necessary to use the two multipoint beam monitors 24 and 26 utilized in the embodiment described above. For example, if desired, a single multipoint beam monitor that slides in the Z-direction may be used in place of the two multipoint beam monitors 24 and 26. Alternatively, a single beam current meter that slides in the X-direction, or further in the Z-direction, may be used. However, the use of the two multipoint beam monitors 24 and 26 has the advantage of eliminating the need for a moving mechanism which would be necessary to slide a single multipoint beam monitor or beam current meter. Therefore, when the two multipoint beam monitors are used, the collimation of the ion beam 2 can be measured with a simple construction without requiring an unduly long time. The advantage of using the two multipoint beam monitors 24 and 26 also applies in the method of shaping the scanning waveform of the ion beam which is to be described in detail below.

As has been described, the ion implanter of the present invention is capable of measuring the collimation of the ion beam 2. If necessary, this ion implanter may be adapted to shape the waveform of the scanning electrode voltages in order to attain a constant scanning speed and a predetermined profile, or cross-sectional shape, of the ion beam.

Figure 5:
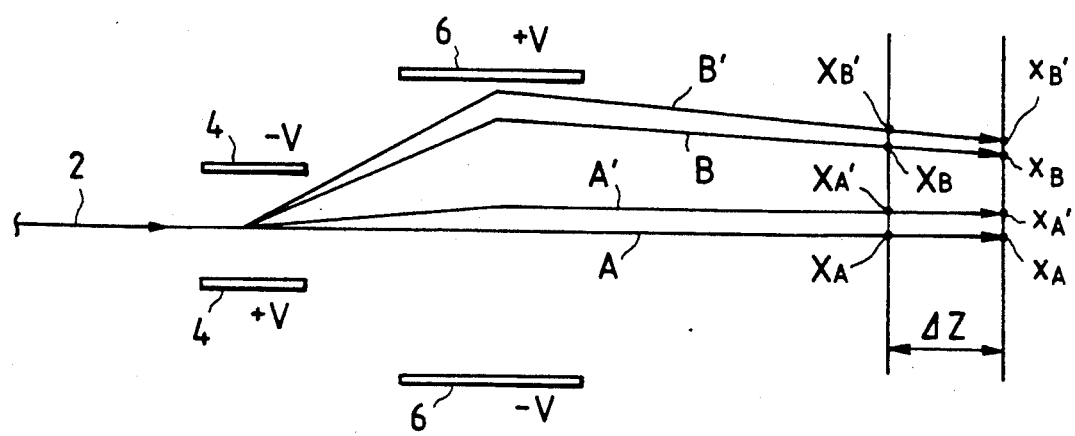
FIG. 5 is a diagram showing an example of ion beam paths for both large and small scanning electrode voltage amplitudes.

FIG. 5 shows an example of the ion beam paths both in the case where large and small voltage amplitudes are utilized. In FIG. 5, paths A, A', B and B, are created when voltages $+V_A$, $+V_A'$, $+V_B$ and $+V_B'$ are respectively applied to one of the scanning electrodes 4 and a scanning electrode 6 opposite to it, and when voltages $-V_A$, $-V_A'$, $-V_B$ and $-V_B'$ are respectfully applied to the other of the scanning electrodes 4 and the scanning electrode 6 located opposite to the other scanning electrode 4. When $V_A'-V_A=V_B'-V_B$, the 4 points of incidence $x_A$, $x_A'$, $x_B$ and $x_B'$ on the targets satisfy the relationship $x_A'-x_A>x_B'-x_B$. In other words, the ion beam 2 tends to converge toward the center of the target. Thus, when beam scanning is performed with a triangular wave (dv/dt=constant), the speed of scanning over the target will increase in the small-amplitude region and decrease in the large-amplitude region. As a consequence, the dose of ion implantation into the target increases towards the periphery of the target. This phenomenon occurs because when large amplitudes are used to create beam paths B and B', the ion beam 2, as it passes between the downstream scanning electrodes 6, travels closer to the electrode having the higher potential (positive), and therefore is decelerated and bent back by an increased degree.

In order to compensate for this unevenness in the dose of ion implantation, the scanning waveform controlling the ion beam 2 must be shaped in such a way that its scanning speed is increased in the large amplitude region.

All of the above problems encountered in connection with conventional methods (A) and (B), described hereinbefore, can be obviated by shaping the scanning waveform in accordance with the following method of the present invention.

The method of shaping a scanning waveform in the embodiment of the present invention under discussion can be implemented with the same circuit configuration as that shown in FIGS. 1 and 2. As in the case of the collimation measurement, data acquisitioning and other steps for shaping the scanning waveform can be performed when the target 8 or the holder 10 is not in the ion implantation position (i.e., when the target 8 or holder 10 is positioned such that the ion beam 2 is admitted into the downstream multipoint beam monitor 26).

In accordance with the present invention, the scanning waveform controlling an ion beam, and therefore the form or profile of the ion beam, can be shaped by the following procedure:

(1) First of all, steps (1)-(4) which were described in connection with the measurement of the collimation of ion beam 2 are repeated to determine the scanning positions of ion beam 2 at each of the upstream and downstream multipoint beam monitors 24 and 26 as a function of continuous time.

(2) Then, based on the position of target 8 relative to the two multipoint beam monitors 24 and 26, as well as the continuous time functions for monitors 24 and 26 determined in step (1), the scanning position of the ion beam 2 on the target 8 at time t is determined.

Figure 6:
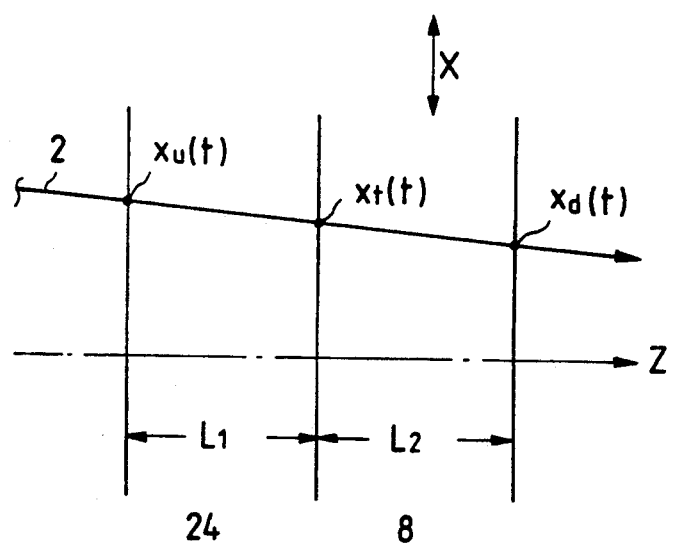
FIG. 6 is a diagram showing an example of a scanning position of an ion beam on a target as it relates to a scanning position of the ion beam on each of a multipoint monitor located at an upstream location of the ion beam, a multipoint beam monitor located at a downstream location of the ion beam and an intermediate target.

Stated more specifically, with reference to FIG. 6, if the distance between the target 8 and the multipoint beam monitor 24 is $L_1$ and the distance between the target 8 and the multipoint beam monitor 26 is $L_2$, then the scanning position of the ion beam 2 on the target 8 at time t (i.e., the scanning position xt(t)) can be determined in accordance with the following equation:

$$xt(t)=(L_2 xu(t)+L_1 xd(t))/(L_1+L_2), \quad (2)$$

wherein xu(t) is the scanning position of the ion beam 2 on multipoint monitor 24, and xd(t) is the scanning position of the ion beam 2 on multipoint beam monitor 26.

Figure 7:
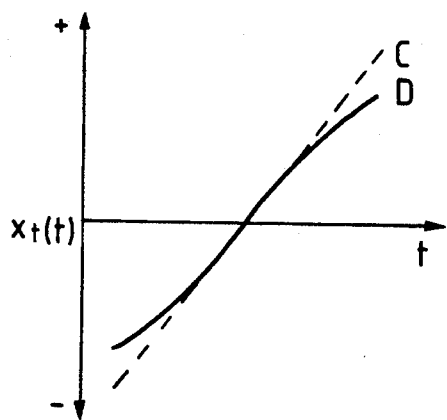
FIG. 7 is a graph showing an example of a time-dependent change in a scanning position of an ion beam.

Two examples of the time-dependent change in the scanning position xt(t) on target 8 as determined by equation (2) above are depicted in FIG. 7. If the speed of scanning of the ion beam 2 over the target 8 is constant, the plot of the time-dependent change in scanning position xt(t) is a straight line as indicated by the dashed line C in FIG. 7. If, however, the scanning speed is slow at the periphery of target 8 (e.g., in the case where the ion beam tends to converge toward the center of the target 8 such as shown in FIG. 5), the plot is nonlinear as indicated by solid line D in FIG. 7.

(3) If the speed of scanning over the target 8 is found to be constant in step (2), there is no need to shape the scanning waveform of ion beam 2 and the shaping process ends at this point.

Figure 8:
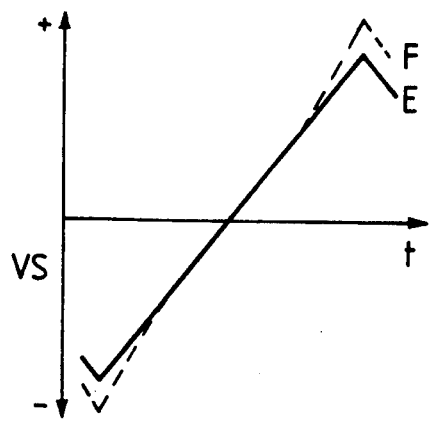
FIG. 8 is a graph showing an example of a time-dependent change in a scanning signal.
Figure 9:
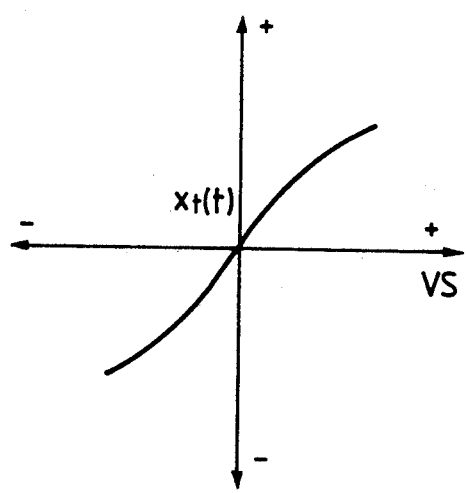
FIG. 9 is a graph showing an example of a relationship between a scanning signal and a scanning position of an ion beam.

(4) If the speed of scanning over the target 8 is not constant, both the data of the scanning signal VS produced by arbitrary waveform generator 221 during the sampling of the beam current I of ion beam 2 (e.g., the waveform indicated by the solid line E in FIG. 8, which is already known), and the function described above with reference to FIG. 7 are used to determine a correspondence between the scanning signal VS and the scanning position xt(t) of the ion beam 2 on target 8. As a consequence, a function having a shape such as shown in FIG. 9 can be obtained. This function can be utilized to predict what value of the scanning signal VS should be produced by the arbitrary waveform generator 221 in the scanning power source 22 in order to cause the ion beam 2 to strike the target 8 at a desired position.

(5) Based on the function shown in FIG. 9, or a function of this type, the waveform of the scanning signal VS is shaped in such a way that the plot of xt(t) in FIG. 7 becomes straight as represented by dashed line C. In the present case under consideration, this may be accomplished by slightly raising the area around the peak of the scanning signal VS in a manner consistent with dashed line F of FIG. 8. With reference to FIG. 1, in the specific embodiment under discussion, the scanning waveform DS is reconstructed in the control unit 30 after the waveform of the scanning signal VS is shaped in order to produce new data of that corresponds to the scanning signal VS so shaped. The reconstructed scanning waveform data DS is then supplied to the arbitrary waveform generator 221.

(6) At this point, the method returns to step (1) and the foregoing procedure is repeated until a required constant scanning speed is obtained at target 8 (i.e., until the curve indicated by solid line D in FIG. 7 is reshaped into a desired straight line such as broken line C).

Unlike the prior art method which measures the scanning speed on a beam monitor, the above-described method of the present invention determines the speed of scanning of ion beam 2 over the target 8 by utilizing calculations. In addition, the ion beam 2 of the present invention travels straight except when it passes between scanning electrodes, so that the speed of the scanning of the ion beam of the target 8 can be determined in a way which is correct. As a result, the difference between the target 8 and each of the multipoint beam monitors 24 and 26 can be ignored, and the scanning waveform that permits the ion beam 2 to be scanned over the target 8 at a constant speed (i.e., such that a uniform dose of ion is implanted into the target 8 in the beam scanning direction) can be constructed in a way which is correct.

Furthermore, the multipoint beam monitors 24 and 26 need not be movable and hence can be designed to operate using a simple mechanism.

Unless there is a another abnormalcy in the system, the beam current I of ion beam 2 can be sampled by performing only two scanning cycles, one for each of the upstream and downstream multipoint monitors 24 and 26, respectively. Accordingly, compared to the prior art method involving simulated calculations for potential distribution, the method of the present invention permits the scanning waveform to be shaped rapidly.

As an additional advantage, the method according to the embodiment under consideration shapes the scanning waveform and includes compensation for the nonlinearity of high-voltage amplifiers 222 and 223 in the scanning power source 22. As a result, the scanning waveform can be shaped in a correct way without being influenced by the variations in the characteristics of nonlinear devices such as high-voltage amplifiers 222 and 223.

In the foregoing description, it is assumed that the two multipoint beam monitors 24 and 26 are positioned in such a way that the target 8 is placed between them. However, this is not the sole case for the arrangement of these multipoint beam monitors. For example, various other situations in which monitor 24 is placed in an upstream location of ion beam 2 and monitor 26 is positioned at a downstream location of ion beam 2 are envisioned.

If desired, either one of the multipoint beam monitors 24 and 26, or both of these monitors, may be offset either upward or downward (in the Y-direction) from the beam path of the ion beam implanted into the target 8. This will not cause any inconvenience in measuring the time-dependent change in the scanning position of ion beam 2 as it is being scanned in the X-direction.

Figure 10:
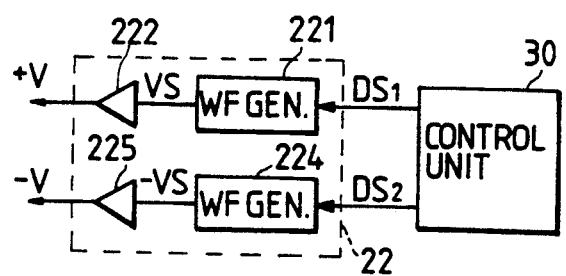
FIG. 10 is a block diagram showing a modified configuration of the scanning power source used in the ion implanter of FIG. 1.

Another modification that can be made concerns the scanning power source 22. As shown in FIG. 10, the scanning power source 22 may comprise two variable waveform generators 221 and 224 that generate opposite polarity scanning signals +VS and −VS in response to scanning waveform data $DS_1$ and $DS_2$, respectively, from the control unit 30. The scanning power source may also comprise two high-voltage amplifiers 222 and 225 that boost the scanning signals +VS and −VS to output opposite polarity scanning voltages +V and −V, respectively. In this modified arrangement, scanning waveform data $DS_1$ and $DS_2$ that have been computed in the same way as already described above are supplied from the control unit 30 into the variable waveform generators 221 and 224. In this way, the waveforms of scanning voltages to be supplied to the scanning electrodes 4 and 6 can be varied independently of each other on the +V and −V sides, whereby the desired compensation can be achieved through even finer adjustments.

The concept of the present invention is applicable not only to the case described above where ion beam 2 performs collimated scanning electrostatically controlled, but also to other cases of scanning such as where electrostatic scanning is combined with deflections by a magnetic field.

It should also be noted that the terms "X-direction" and "Y-Direction" are merely used to designate two directions that are crossed at right angles. Therefore, the X-direction may be regarded as a horizontal or vertical direction or even as a direction inclined therefrom.

As described above, according to a first aspect of the present invention, the collimation of an ion beam and its profile in the beam scanning direction ca be measured quantitatively and with high precision without relying upon the experience or hunches made by the operator. As a result, abnormal collimation of the ion beam that has occurred because of various causes can be detected in a simple and reliable way.

Furthermore, there is no need to destroy the vacuum in the vacuum chamber enclosing the ion implanter, and the collimation of the ion beam can be measured as is required in a simple way.

If two multipoint beam monitors are used for electrical ion beam detection, the collimation of the ion beam can be measured with a simple construction and without taking unduly long time.

According to the second aspect of the present invention, which provides a method of shaping the form of an ion beam, the speed of scanning of the ion beam over the target is determined by calculations so that a scanning waveform that permits the ion beam to be scanned over the target at a constant speed (i.e., that permits a uniform does of ions to be implanted into the target in the beam scanning direction) can be constructed in a way which is correct. Furthermore, at least two cycles of scanning, one for a position downstream of the ion beam and one for a position upstream thereof, will suffice for a measurement of the ion beam. Therefore, compared to the prior art method involving simulated calculations for potential distribution, the method of the present invention permits the scanning waveform controlling the ion beam to be shaped rapidly. Another advantage of the present invention is that the method of the present invention shapes the scanning waveform controlling the ion beam and includes compensation for the nonlinearity of the scanning power source so that the scanning waveform can be shaped in a way which is correct without being influenced by variations in the characteristics of the scanning power source.

If two multipoint beam monitors are used for electrical ion beam detection, the intended waveform shaping can be accomplished with a simple construction and without taking an unduly long time.

The ion implanter according to a third aspect of the present invention has two multipoint beam monitors of this type located upstream and downstream of the ion beam, respectively, so that by using such an ion implanter the above-described methods for measuring the collimation of the ion beam and for shaping its form can be implemented in a way which is simple and correct.

The foregoing description of the embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of measuring collimation of an ion beam used for electrostatically-controlled collimated scanning, said ion beam being emitted from an ion beam source, and said method comprising the steps of:
   electrically detecting the ion beam at a first location and at a second location to determine a time-dependent change in a scanning position of the ion beam at both the first location and the second location, the first location being closer to the ion beam source than the second location;
   determining positions of the ion beam at the first and second locations at mutually corresponding times based on the time-dependent change determination; and
   determining a degree of collimation of the ion beam based on a relationship between the positions of the ion beam at the first and second locations.

2. A method according to claim 1, wherein the detecting step comprises electrically detecting the ion beam by a multipoint beam monitor located at the first location and a multipoint beam monitor located at the second location, the multipoint beam monitors each including a plurality of beam detecting points, positioned so that each monitor has the same set of detecting point coordinate values in a scanning direction of the ion beam, for electrically detecting the ion beam, and the positions of the beam detecting points being predetermined.

3. A method of shaping a scanning waveform controlling an ion beam used for electrostatically-controlling collimated scanning, said ion beam being emitted from an ion beam source, and said method comprising the steps of:
   electrically detecting the ion beam at a first location and a second location to determine a time-dependent change in a scanning position of the ion beam at both the first location and the second location, the first location being closer to the ion beam source than the second location;
   determining, based on the time-dependent change determination, a time-dependent change in a scanning position of the ion beam on a target in accordance with a relationship between measured positions of the ion beam at the first and second locations and a position of the target; and
   shaping the scanning waveform controlling the ion beam such that when the ion beam is being scanned over the target, the time-dependent change in the scanning position of the ion beam on the target will be constant.

4. A method according to claim 3, wherein the detecting step comprises electrically detecting the ion beam by a multipoint beam monitor location at the first location and a multipoint beam monitor located at the second location, the multipoint beam monitors each including a plurality of beam detecting points, positioned so that each monitor has the same set of detecting point coordinate values in a scanning direction of the ion beam, for electrically detecting the ion beam, and the positions of the beam detecting points being predetermined.

5. An ion implanter for performing electrostatically-controlled collimated scanning using an ion beam emitted from an ion beam source, said implanter comprising a first multipoint beam monitor location at a first location and a second multipoint monitor location at a second location, the first location being closer to the ion beam source than the second location, said monitors each comprising a plurality of beam detecting points positioned so that each monitor has the same set of detecting point coordinate values in a scanning direction of the ion beam for electrically detecting the ion beam, and the positions of the beam detecting points being predetermined.

6. An ion implanter according to claim 5, further comprising a control system for shaping a scanning waveform controlling the ion beam in response to electrical detection of the ion beam by the multipoint monitors.

7. An ion beam implanter according to claim 6, wherein said control system comprises a sampling unit for sampling a beam current of the ion beam and a waveform generator for controlling the scanning waveform controlling the ion beam and for providing a synchronization signal to the sampling unit.

8. An ion beam implanter according to claim 5, wherein said multipoint beam monitors each comprise an array of beam current meters.

9. An ion beam implanter according to claim 5, wherein said multipoint beam monitors each comprise a single beam current meter disposed behind a mask having a plurality of apertures.

10. An ion implanter according to claim 5, wherein said ion implanter detects a scanning position xt(t) of the ion beam at a time t on a target located between the multipoint beam monitors in accordance with the following equation:

$$xt(t) = (L_2 \, xu(t) + L_1 \, xd(t))/(L_1 + L_2),$$

where xu(t) is a scanning position of the ion beam on the first multipoint beam monitor at time t, xd(t) is a scanning position of the ion beam on the second multipoint beam monitor at time t, $L_1$ is the distance between the target and the first multipoint beam monitor, and $L_2$ is the distance between the target and the second multipoint beam monitor.

11. An ion implanter for performing electrostatically-controlled collimated scanning of a target using an ion beam, said implanter comprising a first multibeam monitor located at a first location and a second multipoint monitor located at a second location, the target being located between the first and second locations, said monitors each comprising a plurality of beam detecting points positioned so that each monitor has the same set of detecting point coordinate values in a scanning direction of the ion beam for electrically detecting the ion beam, and the positions of the beam detecting points being predetermined.

* * * * *

UNITED STATES PATENT AND TRADEMARK OFFICE
CERTIFICATE OF CORRECTION

PATENT NO. : 5,180,918
DATED : January 19, 1993
INVENTOR(S) : Michiro Isobe It is certified that error appears in the above-identified patent and that said Letters Patent is hereby corrected as shown below:

Claim 3, column 13, line 35, change "electrostatically-controlling" to --electrostatically-controlled--.

Signed and Sealed this

Eighth Day of February, 1994

Attest:

BRUCE LEHMAN

Attesting Officer

Commissioner of Patents and Trademarks